US009868387B2

(12) United States Patent
Salter et al.

(10) Patent No.: US 9,868,387 B2
(45) Date of Patent: Jan. 16, 2018

(54) PHOTOLUMINESCENT PRINTED LED MOLDING

(71) Applicant: Ford Global Technologies, LLC, Dearborn, MI (US)

(72) Inventors: Stuart C. Salter, White Lake, MI (US); Paul Kenneth Dellock, Northville, MI (US); James J. Surman, Clinton Township, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 214 days.

(21) Appl. No.: 14/696,960

(22) Filed: Apr. 27, 2015

(65) Prior Publication Data

US 2015/0232019 A1 Aug. 20, 2015

Related U.S. Application Data

(63) Continuation-in-part of application No. 14/603,636, filed on Jan. 23, 2015, now Pat. No. 9,573,517, which
(Continued)

(51) Int. Cl.
*B60Q 1/00* (2006.01)
*B60Q 1/26* (2006.01)
(Continued)

(52) U.S. Cl.
CPC ......... *B60Q 1/2653* (2013.01); *B60Q 1/0005* (2013.01); *B60Q 1/0088* (2013.01);
(Continued)

(58) Field of Classification Search
CPC ...... B60Q 1/0005; B60Q 1/0088; B60Q 1/32; B60Q 1/2653; B60Q 1/2611; B60Q 3/208;
(Continued)

(56) References Cited

U.S. PATENT DOCUMENTS 2,486,859 A 11/1949 Meijer et al.
5,053,930 A 10/1991 Benavides
(Continued)

FOREIGN PATENT DOCUMENTS

CN 201169230 Y 12/2008
CN 101337492 A 1/2009
(Continued)

*Primary Examiner* — Sean Gramling
*Assistant Examiner* — Gerald J Sufleta, II
(74) *Attorney, Agent, or Firm* — Jason Rogers; Price Heneveld LLP

(57) ABSTRACT

An illumination apparatus configured to seal and substantially conform to a roof ditch of a vehicle is disclosed. The illumination apparatus comprises a first electrode in connection with a seam of the roof ditch via an adhesive. A plurality of printed LEDs configured to emit a first emission and suspended in a semiconductor ink is disposed on a surface of the first electrode, and a second electrode is conductively connected to the plurality of LEDs. A photoluminescent layer is disposed on the second electrode. The illumination apparatus may be in communication with a controller via the first and second electrodes such that the controller may selectively activate the illumination apparatus.

20 Claims, 6 Drawing Sheets

Related U.S. Application Data is a continuation-in-part of application No. 14/086,442, filed on Nov. 21, 2013.

(51) Int. Cl.
*F21S 8/10* (2006.01)
*B60Q 1/32* (2006.01)

(52) U.S. Cl.
CPC .............. *B60Q 1/32* (2013.01); *F21S 48/215* (2013.01); *F21S 48/218* (2013.01); *F21S 48/2218* (2013.01)

(58) Field of Classification Search
CPC ................. B60Q 3/217; B60Q 3/54; F21S 48/215–48/218
See application file for complete search history.

(56) References Cited

U.S. PATENT DOCUMENTS

| | | |
|---|---|---|
| 5,709,453 A | 1/1998 | Krent et al. |
| 5,839,718 A | 11/1998 | Hase et al. |
| 6,031,511 A | 2/2000 | DeLuca et al. |
| 6,117,362 A | 9/2000 | Yen et al. |
| 6,419,854 B1 | 7/2002 | Yocom et al. |
| 6,494,490 B1 | 12/2002 | Trantoul |
| 6,577,073 B2 | 6/2003 | Shimizu et al. |
| 6,729,738 B2 | 5/2004 | Fuwausa et al. |
| 6,737,964 B2 | 5/2004 | Samman et al. |
| 6,773,129 B2 | 8/2004 | Anderson, Jr. et al. |
| 6,820,888 B1 | 11/2004 | Griffin |
| 6,851,840 B2 | 2/2005 | Ramamurthy et al. |
| 6,859,148 B2 | 2/2005 | Miller |
| 6,871,986 B2 | 3/2005 | Yamanaka et al. |
| 6,953,536 B2 | 10/2005 | Yen et al. |
| 6,990,922 B2 | 1/2006 | Ichikawa et al. |
| 7,015,893 B2 | 3/2006 | Li et al. |
| 7,161,472 B2 | 1/2007 | Strumolo et al. |
| 7,213,923 B2 | 5/2007 | Liu et al. |
| 7,216,997 B2 | 5/2007 | Anderson, Jr. |
| 7,264,366 B2 | 9/2007 | Hulse |
| 7,264,367 B2 | 9/2007 | Hulse |
| 7,441,914 B2 | 10/2008 | Palmer et al. |
| 7,501,749 B2 | 3/2009 | Takeda et al. |
| 7,575,349 B2 | 8/2009 | Bucher et al. |
| 7,635,212 B2 | 12/2009 | Seidler |
| 7,745,818 B2 | 6/2010 | Sofue et al. |
| 7,753,541 B2 | 7/2010 | Chen et al. |
| 7,834,548 B2 | 11/2010 | Jousse et al. |
| 7,862,220 B2 | 1/2011 | Cannon et al. |
| 7,987,030 B2 | 7/2011 | Flores et al. |
| 7,994,529 B2 | 8/2011 | Bierhuizen et al. |
| 8,016,465 B2 | 9/2011 | Egerer et al. |
| 8,022,818 B2 | 9/2011 | la Tendresse et al. |
| 8,044,415 B2 | 10/2011 | Messere et al. |
| 8,066,416 B2 | 11/2011 | Bucher |
| 8,071,988 B2 | 12/2011 | Lee et al. |
| 8,097,843 B2 | 1/2012 | Agrawal et al. |
| 8,120,236 B2 | 2/2012 | Auday et al. |
| 8,136,425 B2 | 3/2012 | Bostick |
| 8,163,201 B2 | 4/2012 | Agrawal et al. |
| 8,178,852 B2 | 5/2012 | Kingsley et al. |
| 8,197,105 B2 | 6/2012 | Yang |
| 8,203,260 B2 | 6/2012 | Li et al. |
| 8,207,511 B2 | 6/2012 | Bortz et al. |
| 8,232,533 B2 | 7/2012 | Kingsley et al. |
| 8,247,761 B1 | 8/2012 | Agrawal et al. |
| 8,286,378 B2 | 10/2012 | Martin et al. |
| 8,408,766 B2 | 4/2013 | Wilson et al. |
| 8,415,642 B2 | 4/2013 | Kingsley et al. |
| 8,421,811 B2 | 4/2013 | Odland et al. |
| 8,466,438 B2 | 6/2013 | Lambert et al. |
| 8,519,359 B2 | 8/2013 | Kingsley et al. |
| 8,519,362 B2 | 8/2013 | Labrot et al. |
| 8,552,848 B2 | 10/2013 | Rao et al. |
| 8,606,430 B2 | 12/2013 | Seder et al. |
| 8,624,716 B2 | 1/2014 | Englander |
| 8,631,598 B2 | 1/2014 | Li et al. |
| 8,664,624 B2 | 3/2014 | Kingsley et al. |
| 8,683,722 B1 | 4/2014 | Cowan |
| 8,724,054 B2 | 5/2014 | Jones |
| 8,754,426 B2 | 6/2014 | Marx et al. |
| 8,773,012 B2 | 7/2014 | Ryu et al. |
| 8,846,184 B2 | 9/2014 | Agrawal et al. |
| 8,851,694 B2 | 10/2014 | Harada |
| 8,876,352 B2 | 11/2014 | Robbins et al. |
| 8,952,341 B2 | 2/2015 | Kingsley et al. |
| 9,006,751 B2 | 4/2015 | Kleo et al. |
| 9,018,833 B2 | 4/2015 | Lowenthal et al. |
| 9,057,021 B2 | 6/2015 | Kingsley et al. |
| 9,065,447 B2 | 6/2015 | Buttolo et al. |
| 9,187,034 B2 | 11/2015 | Tarahomi et al. |
| 9,299,887 B2 | 3/2016 | Lowenthal et al. |
| 2002/0159741 A1 | 10/2002 | Graves et al. |
| 2002/0163792 A1 | 11/2002 | Formoso |
| 2003/0167668 A1 | 9/2003 | Fuks et al. |
| 2003/0179548 A1 | 9/2003 | Becker et al. |
| 2004/0213088 A1 | 10/2004 | Fuwausa |
| 2006/0087826 A1 | 4/2006 | Anderson, Jr. |
| 2006/0097121 A1 | 5/2006 | Fugate |
| 2007/0032319 A1 | 2/2007 | Tufte |
| 2007/0285938 A1 | 12/2007 | Palmer et al. |
| 2007/0297045 A1 | 12/2007 | Sakai et al. |
| 2009/0219730 A1 | 9/2009 | Syfert et al. |
| 2009/0251920 A1 | 10/2009 | Kino et al. |
| 2009/0260562 A1 | 10/2009 | Folstad et al. |
| 2009/0262515 A1 | 10/2009 | Lee et al. |
| 2011/0012062 A1 | 1/2011 | Agrawal et al. |
| 2012/0001406 A1 | 1/2012 | Paxton et al. |
| 2012/0104954 A1 | 5/2012 | Huang |
| 2012/0183677 A1 | 7/2012 | Agrawal et al. |
| 2012/0280528 A1 | 11/2012 | Dellock et al. |
| 2013/0092965 A1 | 4/2013 | Kijima et al. |
| 2013/0335994 A1 | 12/2013 | Mulder et al. |
| 2014/0029281 A1 | 1/2014 | Suckling et al. |
| 2014/0065442 A1 | 3/2014 | Kingsley et al. |
| 2014/0103258 A1 | 4/2014 | Agrawal et al. |
| 2014/0211498 A1 | 7/2014 | Cannon et al. |
| 2014/0264396 A1 | 9/2014 | Lowenthal et al. |
| 2014/0266666 A1 | 9/2014 | Habibi |
| 2014/0373898 A1 | 12/2014 | Rogers et al. |
| 2015/0046027 A1 | 2/2015 | Sura et al. |
| 2015/0109602 A1 | 4/2015 | Martin et al. |
| 2015/0138789 A1 | 5/2015 | Singer et al. |
| 2015/0251592 A1* | 9/2015 | Fisher .................. B60Q 1/2611 362/548 |
| 2015/0267881 A1 | 9/2015 | Salter et al. |
| 2016/0016506 A1 | 1/2016 | Collins et al. |
| 2016/0169484 A1* | 6/2016 | Min ..................... F21V 15/015 362/217.17 |
| 2016/0236613 A1 | 8/2016 | Trier |

FOREIGN PATENT DOCUMENTS

| | | |
|---|---|---|
| CN | 201193011 Y | 2/2009 |
| CN | 204127823 U | 1/2015 |
| DE | 4120677 A1 | 1/1992 |
| DE | 29708699 U1 | 7/1997 |
| DE | 10319396 A1 | 11/2004 |
| EP | 1793261 A1 | 6/2007 |
| EP | 2778209 A1 | 9/2014 |
| JP | 2000159011 A | 6/2000 |
| JP | 2007238063 A | 9/2007 |
| KR | 20060026531 A | 3/2006 |
| WO | 2006047306 A1 | 5/2006 |
| WO | 2014068440 A1 | 5/2014 |

\* cited by examiner

PHOTOLUMINESCENT PRINTED LED MOLDING

CROSS-REFERENCE TO RELATED APPLICATIONS

This application is a continuation-in-part of U.S. patent application Ser. No. 14/603,636, filed Jan. 23, 2015, now U.S. Pat. No. 9,573,517, and entitled "DOOR ILLUMINATION AND WARNING SYSTEM," which is a continuation-in-part of U.S. patent application Ser. No. 14/086,442, filed Nov. 21, 2013, and entitled "VEHICLE LIGHTING SYSTEM WITH PHOTOLUMINESCENT STRUCTURE." The aforementioned related applications are hereby incorporated by reference in their entirety.

FIELD OF THE INVENTION

The present disclosure generally relates to vehicle lighting systems, and more particularly, to vehicle lighting systems having thin profiles that may be operable to conform to non-planar surfaces.

BACKGROUND OF THE INVENTION

Lighting in vehicles traditionally has been applied to provide illumination for reading, vehicle entry, and operation. However, lighting may also be applied to improve vehicle features and systems to ensure that vehicle passengers, operators, and onlookers have an improved experience. Such improvements may arise from improvements in safety, visibility, aesthetics, and/or features. The disclosure provides for a lighting system operable to illuminate a portion of a vehicle and in some embodiments, may illuminate a portion of a roof of a vehicle.

SUMMARY OF THE INVENTION

According to one aspect of the present disclosure, an illumination apparatus configured to be disposed along a seam of a vehicle is disclosed. The illumination apparatus comprises a plurality of lighting portions disposed along the seam. Each of the lighting portions comprises a first electrode, a plurality of printed light emitting diodes (LEDs) suspended in a semiconductor ink on a surface of the first electrode, and a second electrode in electrical connection with the plurality of printed LEDs. A photoluminescent layer is disposed on the second electrode. A plurality of electrical conductors extend along the plurality of lighting portion and are in connection with at least one of the first electrode and the second electrode to supply power to each of the lighting portions.

According to another aspect of the present disclosure, an illumination apparatus configured to seal and substantially conform to a roof ditch of a vehicle is disclosed. The illumination apparatus comprises a first electrode in connection with a seam of the roof ditch via an adhesive. A plurality of printed LEDs configured to emit a first emission and suspended in a semiconductor ink is disposed on a surface of the first electrode, and a second electrode is conductively connected to the plurality of LEDs. A photoluminescent layer is disposed on the second electrode. The illumination apparatus may be in communication with a controller via the first and second electrodes such that the controller may selectively activate the illumination apparatus.

According to yet another aspect of the present disclosure, an illumination apparatus configured to seal and substantially conform to a roof ditch is disclosed. The illumination apparatus comprises a plurality of lighting portions extending along a trough formed by the roof ditch. Each of the lighting portions comprises a first electrode in connection with a seam of the roof ditch via an adhesive. A plurality of printed LEDs configured to emit a first emission and suspended in a semiconductor ink is disposed on a surface of the first electrode. A second electrode is in electrical connection with the plurality of printed LEDs. A photoluminescent layer is disposed on the second electrode. A controller is in communication with the first and second electrodes and configured to selectively illuminate the plurality of lighting portions.

These and other aspects, objects, and features of the present disclosure will be understood and appreciated by those skilled in the art upon studying the following specification, claims, and appended drawings.

DETAILED DESCRIPTION OF THE PREFERRED EMBODIMENTS

As required, detailed embodiments of the present disclosure are disclosed herein. However, it is to be understood that the disclosed embodiments are merely exemplary of the disclosure that may be embodied in various and alternative forms. The figures are not necessarily to a detailed design and some schematics may be exaggerated or minimized to show function overview. Therefore, specific structural and functional details disclosed herein are not to be interpreted as limiting, but merely as a representative basis for teaching one skilled in the art to variously employ the present disclosure.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

Figure 1:
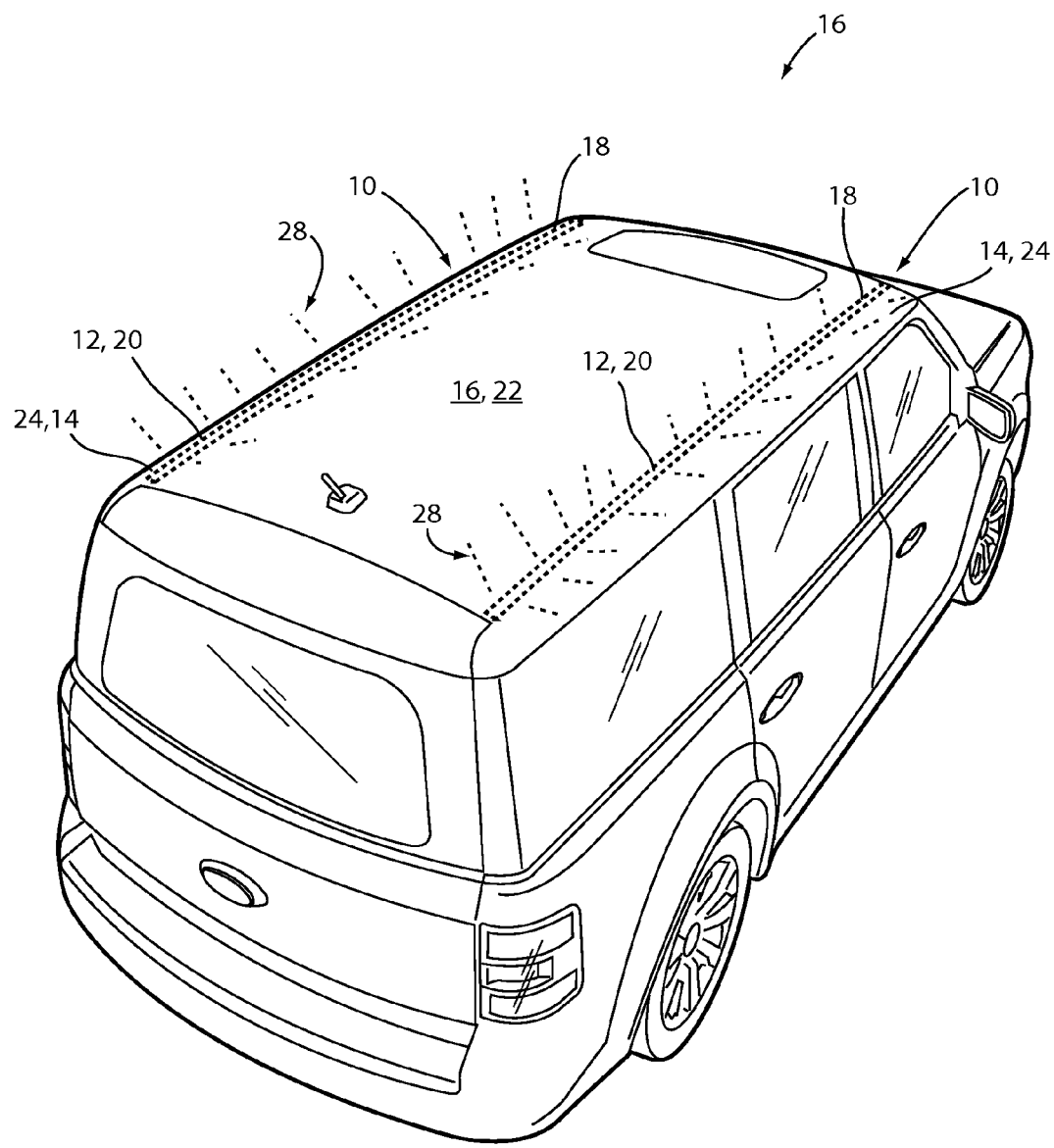
FIG. 1 is a perspective view of an automotive vehicle demonstrating an illumination apparatus.

Referring to FIG. 1, the disclosure describes an illumination apparatus 10 configured to illuminate at least a portion of a seam 12 configured to connect a plurality of panels 14 of a vehicle 16. The seam 12 may correspond to a roof-ditch or various additional portions of the vehicle 16. In some implementations, the illumination apparatus may be implemented in applications that do not include a seam. For example, the illumination apparatus 10 may be implemented in various interior and/or exterior panels of the vehicle 16 and may particularly be applicable in portions of the vehicle 16 forming troughs as well as portions having the illumination apparatus 10 applied over extended distances.

The illumination apparatus 10 may include a light producing assembly 18 corresponding to a thin, flexible lighting assembly. For purposes of this disclosure, a vehicle fixture or panel 14 may refer to any interior or exterior piece of vehicle equipment, or a part thereof, suitable for receiving the illumination apparatus 10 described herein. While the implementations of the illumination apparatus described herein are primarily directed towards automotive vehicle use, it should be appreciated that the apparatus or system may also be implemented in other types of vehicles designed to transport one or more passengers such as, but not limited to, watercrafts, trains, and aircrafts.

In an exemplary embodiment, the illumination apparatus 10 may be configured to produce a seal or molding strip configured to seal and substantially conform to the seam 12 between the panels 14 of the vehicle 16. For example, the illumination apparatus 10 may be configured to substantially conform to a roof ditch 20 that interconnects a roof panel 22 to a body side panel 24. In this configuration the illumination apparatus 10 may be operable to output light to illuminate at least a portion of the vehicle 16. The illumination apparatus 10 may provide beneficial light to improve the visibility of the vehicle 16 and add novel features to illuminate the vehicle 16.

The light assembly 18 may be operable to emit an output emission 28 to illuminate at least a portion of an environment proximate the vehicle 16. The output emission 28 of light is demonstrated by the dashed lines extending from the light producing assembly 18. The light producing assembly 18 may have a thin profile and be of flexible materials providing for the assembly to conform to non-planar surfaces. Although specific examples of the illumination apparatus 10 are discussed in reference to the roof ditch 20, it should be appreciated that the illumination apparatus 10 may be implemented in other portions of the vehicle 16, particularly portions that may form elongated sections and portions corresponding to seams and/or intersections between panels 14 of the vehicle 16.

In an exemplary embodiment, the light assembly 18 is in communication with a controller via conductive leads. The controller may be in communication with various control modules and systems of the vehicle 16 such that the controller may selectively illuminate the illumination apparatus 10 to correspond to one or more states of the vehicle 16. A state of the vehicle 16 may correspond to at least one of a hazard condition, a turn condition, a panic condition, a locking/unlocking condition, a proximity detection of a key fob, and a lighting condition. Lighting conditions may include a brake light activation, a running light condition, low and/or high beam conditions, and/or a parking light condition. The various configurations of the illumination apparatus may provide for beneficial lighting corresponding to various features for the vehicle 16.

Figure 2:
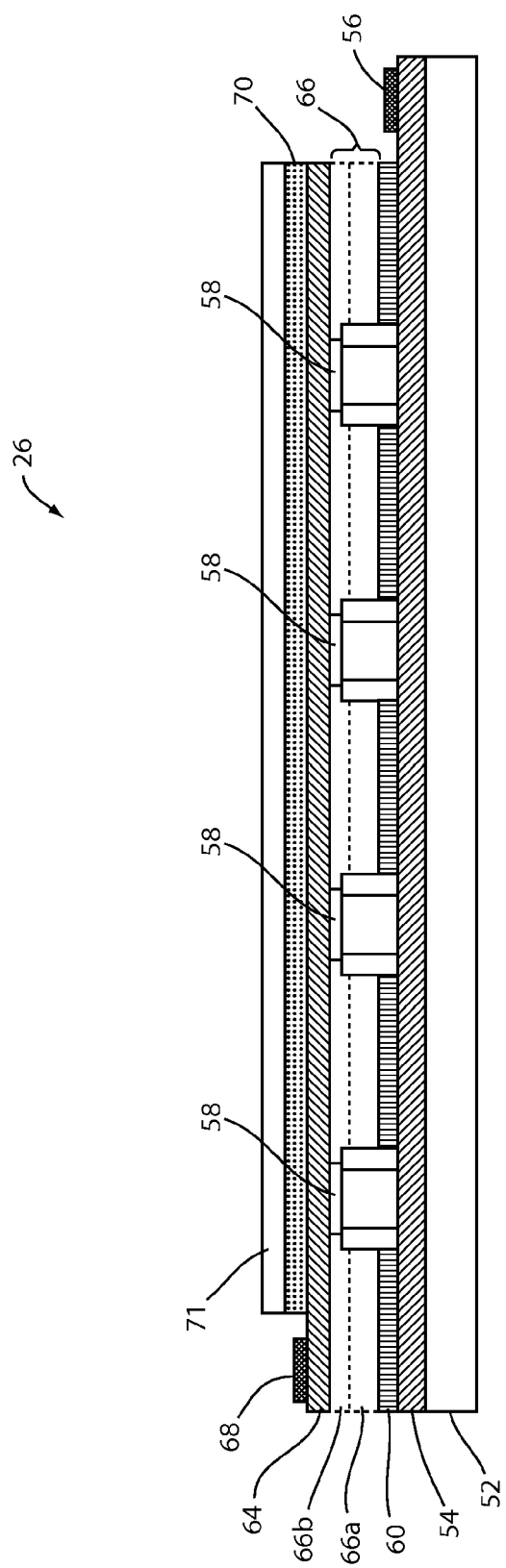
FIG. 2 is a detailed side view of a light producing assembly comprising a photoluminescent layer.

Referring to FIG. 2, the light producing assembly 18 may correspond to a thin-film or printed light emitting diode (LED) assembly. The light producing assembly 18 may comprise a substrate 52. The substrate 52 may be opaque, transparent, or semi-transparent and may be thin. The light producing assembly 18 may be utilized in a variety of applications, which may require a thin overall thickness. The substrate 52 may be of a polymer, for example polycarbonate, poly-methyl methacrylate (PMMA), polyethylene terephthalate (PET), etc. In some embodiments, the substrate 52 may be dispensed from a roll to provide for integration into assembly operations for the light producing assembly 18 and may be approximately 0.005 to 0.060 inches thick.

A first electrode 54 or conductive layer may be disposed on the substrate 52. The first electrode 54 and/or various electrodes or conductive layers discussed herein may comprise a conductive epoxy, such as a silver-containing or copper-containing epoxy. The first electrode 54 is conductively connected to a first bus bar 56. The first bus bar 56 and other bus bars or conduits discussed herein may be of metallic and/or conductive materials which may be screen printed on the electrodes or conductive layers. Bus bars may be utilized in the light producing assembly 18 to conductively connect a plurality of light-emitting diode (LED) sources 58 to a power source. In this way, the first bus bar 56, and other bus bars utilized in the light producing assembly, may be configured to uniformly deliver current along and/or across a surface of the light producing assembly 18.

The LED sources 58 may be printed, dispersed or otherwise applied to the first electrode 54 via a semiconductor ink 60. The semiconductor ink may correspond to a liquid suspension comprising a concentration of LED sources 58 dispersed therein. The concentration of the LED sources may vary based on a desired emission intensity of the light producing assembly 18. The LED sources 58 may be dispersed in a random or controlled fashion within the semiconductor ink 60. The LED sources 58 may correspond to micro-LEDs of gallium nitride elements, which may be approximately 5 microns to 400 microns across a width substantially aligned with the surface of the first electrode. The semiconductor ink 60 may include various binding and dielectric materials including but not limited to one or more of gallium, indium, silicon carbide, phosphorous and/or translucent polymeric binders. In this configuration, the semiconductor ink 60 may contain various concentrations of LED sources 58 such that a surface density of the LED sources 58 may be adjusted for various applications.

In some embodiments, the LED sources 58 and semiconductor ink 60 may be sourced from Nth Degree Technologies Worldwide Inc. The semiconductor ink 60 can be applied through various printing processes, including ink jet and silk screen processes to selected portion(s) of the substrate 52. More specifically, it is envisioned that the LED sources 58 are dispersed within the semiconductor ink 60, and shaped and sized such that a substantial quantity of them preferentially align with the first electrode 54 and a second electrode 64 during deposition of the semiconductor ink 60. The portion of the LED sources 58 that ultimately are electrically connected to the electrodes 54, 64 may be illuminated by a voltage source applied across the first electrode 54 and the second electrode 64. In some embodiments, a power source operating at 12 to 16 VDC from a vehicular power source may be employed as a power source to supply current to the LED sources 58. Additional information regarding the construction of a light producing assembly similar to the light producing assembly 18 is disclosed in U.S. Patent Publication No. 2014-0264396 A1, now U.S. Pat. No. 9,299,887, to Lowenthal et al., entitled "ULTRA-THIN PRINTED LED LAYER REMOVED FROM SUBSTRATE," filed Mar. 12, 2014, the entire disclosure of which is incorporated herein by reference.

At least one dielectric layer 66 may be printed over the LED sources 58 to encapsulate and/or secure the LED sources 58 in position. The at least one dielectric layer 66 may correspond to a first dielectric layer 66a and a second dielectric layer 66b, which may be of a substantially transparent material. The second electrode 64 may correspond to a top transparent conductor layer printed over the dielectric layer 66 to electrically connect the electrodes 54, 64. The second electrode 64 is conductively connected to a second bus bar 68. The bus bars 56, 68 may be utilized in the light producing assembly 18 to conductively connect a plurality of light-emitting diode (LED) sources 58 to the power source.

In some embodiments, the first electrode 54 and the second electrode 64 may correspond to a cathode electrode and an anode electrode, respectively. Though described as a cathode and an anode of the light producing assembly 18, the first electrode 54 and the second electrode 64 may be arranged such that the second electrode 64 (anode) is disposed on the substrate and the first electrode 54 cathode is disposed on the at least one dielectric layer 66. The bus bars 56, 68 may be printed along opposite edges of the electrodes 54, 64 and electrically terminate at anode and cathode terminals. Points of connection between the bus bars 56, 68 and the power source may be at opposite corners of each bus bar 56, 68 for uniform current distribution along each bus.

Still referring to FIG. 2, a photoluminescent layer 70 may be applied to the second electrode 64. The photoluminescent layer may be applied as a coating, layer, film, and/or photoluminescent substrate. The photoluminescent layer 70 may be applied by screen printing, flexography, and/or otherwise affixed to the second electrode 64. In various implementations, the LED sources 58 may be configured to emit an excitation emission comprising a first wavelength corresponding to blue light. The LED sources 58 may be configured to emit the excitation emission into the photoluminescent layer 70 such that the photoluminescent material becomes excited. In response to the receipt of the excitation emission, the photoluminescent material converts the excitation emission from the first wavelength to an output emission comprising at least a second wavelength longer than the first wavelength. Additionally, one or more coatings 71 or sealing layers may be applied to an exterior surface of the light producing assembly 18 to protect the photoluminescent layer 70 and various other portions of the assembly 18 from damage and wear.

Figure 3:
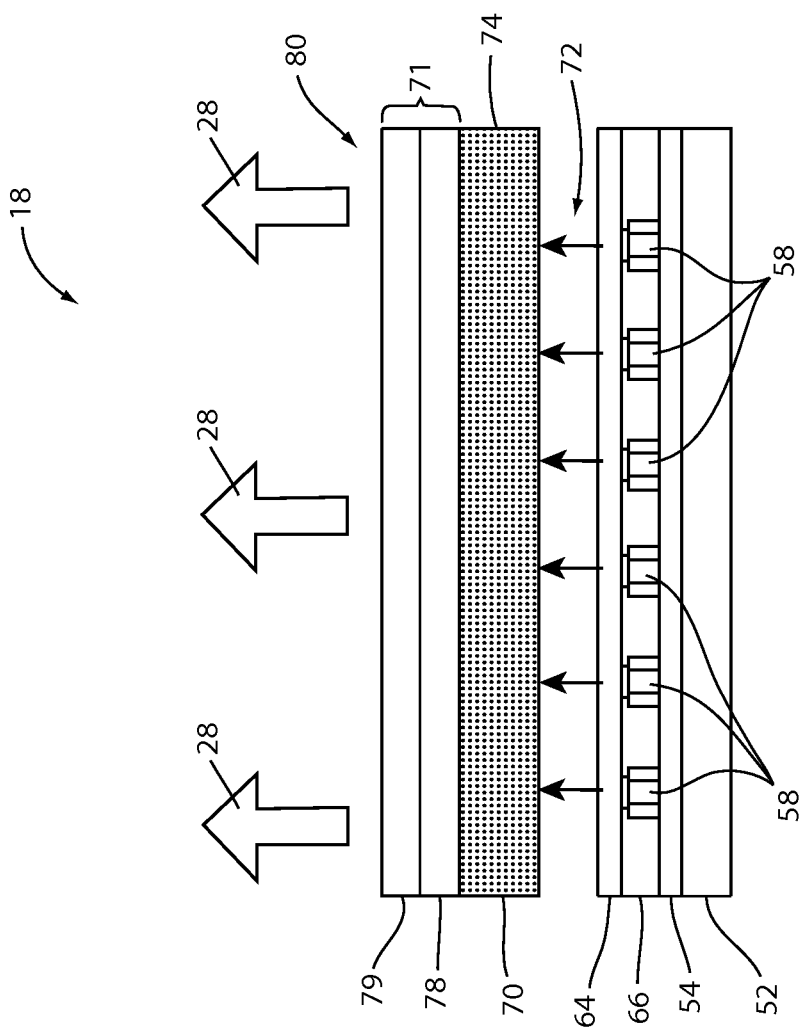
FIG. 3 is a side view of a light producing assembly demonstrating a photoluminescent layer configured to convert a wavelength of light.

Referring now to FIG. 3, a detailed view of photoluminescent layer 70 of the light producing assembly 18 is shown. The light producing assembly 18 is configured similar to the light producing assembly 18 demonstrated in FIG. 2, with like-numbered elements having the same or comparable function and structure. Though not shown in FIG. 6, the LED sources 58 are in electrical communication with the electrodes 54, 64 and a power source such that an excitation emission may be output from LED sources 58.

In an exemplary implementation, the excitation emission 72 may correspond to an excitation emission having a first wavelength corresponding to a blue, violet, and/or ultraviolet spectral color range. The blue spectral color range comprises a range of wavelengths generally expressed as blue light (~440-500 nm). In some implementations, the first wavelength $\lambda_1$ may comprise a wavelength in the ultraviolet and near ultraviolet color range (~100-450 nm). In an exemplary implementation, the first wavelength may be approximately equal to 470 nm. Though particular wavelengths and ranges of wavelengths are discussed in reference to the first wavelength, the first wavelength may generally be configured to excite any photoluminescent material.

In operation, the excitation emission 72 is transmitted into an at least partially light transmissive material of the photoluminescent layer 70. The excitation emission is emitted from the LED sources 58 and may be configured such that the first wavelength corresponds to at least one absorption wavelength of one or more photoluminescent materials disposed in the photoluminescent layer 70. For example, the photoluminescent layer 70 may comprise an energy conversion layer 74 configured to convert the excitation emission 72 at the first wavelength to an output emission 28 having a second wavelength, different from the first wavelength. The output emission 28 may comprise one or more wavelengths, one of which may be longer than the first wavelength. The conversion of the excitation emission 72 to the output emission 28 by the energy conversion layer 74 is referred to as a Stokes shift.

In some embodiments, the output emission 28 may correspond to a plurality of wavelengths. Each of the plurality of wavelengths may correspond to significantly different spectral color ranges. For example, the at least second wavelength of the output emission 28 may correspond to a plurality of wavelengths (e.g. second, third, etc.). In some implementations, the plurality of wavelengths may be combined in the output emission 28 to appear as substantially white light. The plurality of wavelengths may be generated by a red-emitting photoluminescent material having a wavelength of approximately 620-750 nm, a green emitting photoluminescent material having a wavelength of approximately 526-606 nm, and a blue or blue green emitting photoluminescent material having a wavelength longer than the first wavelength $\lambda_1$ and approximately 430-525 nm. In some implementations, a blue or blue green wavelength may correspond to the excitation emission being combined with the output emission 28. As discussed herein, a concentration of the photoluminescent material may be configured to allow at least a portion of the excitation emission to be emitted with the output emission 28 to add a blue hue to the output emission 28. The plurality of wavelengths may be utilized to generate a wide variety of colors of light from the each of the photoluminescent portions converted from the first wavelength. Though the particular colors of red, green, and blue are referred to herein, various photoluminescent materials may be utilized to generate a wide variety of colors and combinations to control the appearance of the output emission 28.

The photoluminescent materials, corresponding to the photoluminescent layer 70 or the energy conversion layer 74, may comprise organic or inorganic fluorescent dyes configured to convert the excitation emission 72 to the output emission 28. For example, the photoluminescent layer 70 may comprise a photoluminescent structure of rylenes, xanthenes, porphyrins, phthalocyanines, or other materials suited to a particular Stokes shift defined by an absorption range and an emission fluorescence. In some embodiments, the photoluminescent layer 70 may be of at least one inorganic luminescent material selected from the group of phosphors. The inorganic luminescent material may more particularly be from the group of Ce-doped garnets, such as YAG:Ce. As such, each of the photoluminescent portions may be selectively activated by a wide range of wavelengths received from the excitation emission 72 configured to excite one or more photoluminescent materials to emit an output emission having a desired color.

Still referring to FIG. 3, the light producing assembly 18 may further include the coating 71 as at least one stability layer 78 configured to protect the photoluminescent material contained within the energy conversion layer 74 from photolytic and/or thermal degradation. The stability layer 78 may be configured as a separate layer optically coupled and adhered to the energy conversion layer 74. The stability layer 78 may also be integrated with the energy conversion layer 74. The photoluminescent layer 70 may also optionally include a protection layer 79 optically coupled and adhered to the stability layer 78 or any layer or coating to protect the photoluminescent layer 70 from physical and chemical damage arising from environmental exposure.

The stability layer 78 and/or the protection layer 79 may be combined with the energy conversion layer 74 to form an integrated photoluminescent structure 80 through sequential coating or printing of each layer, or by sequential lamination or embossing. Additionally, several layers may be combined by sequential coating, lamination, or embossing to form a substructure. The substructure may then be laminated or embossed to form the integrated photoluminescent structure 80. Once formed, the photoluminescent structure 80 may be applied to a surface of at least one of the electrodes 54, 64 such that the excitation emission 72 received from the LED sources 58 and converted to the output emission 28. Additional information regarding the construction of photoluminescent structures to be utilized in at least one photoluminescent portion of a vehicle is disclosed in U.S. Pat. No. 8,232,533 to Kingsley et al., entitled "PHOTOLYTICALLY AND ENVIRONMENTALLY STABLE MULTILAYER STRUCTURE FOR HIGH EFFICIENCY ELECTROMAGNETIC ENERGY CONVERSION AND SUSTAINED SECONDARY EMISSION," filed Jul. 31, 2012, the entire disclosure of which is incorporated herein by reference.

In some embodiments, the coating 71 may further comprise a colored layer applied to the light assembly 18 and configured to control or adjust an appearance of the light assembly 18 in an unilluminated state. As discussed later in reference to FIG. 4, the colored layer may correspond to the coating 71 and/or a cover portion 102. The colored layer may comprise an at least partially light transmissible polymeric layer or coating that may be applied to an outer surface of the light assembly 18. The colored layer may be tinted any color to suit a desired appearance of the light assembly 18. In an exemplary embodiment, the photoluminescent material of the energy conversion layer 74 may correspond to various colors emitted by a rylene dye. The use of such dyes may cause the photoluminescent layer 70 to have a somewhat colored appearance corresponding to a particular dye or combination utilized for the photoluminescent layer 70. In such embodiments, the colored layer may be utilized to tint the light assembly 18 to desired color such that the light assembly 18 may have a desired appearance when the LED sources are inactive. In this way, the light assembly may have a desired color appearance when the LED sources 58 are both active and inactive.

Figure 4:
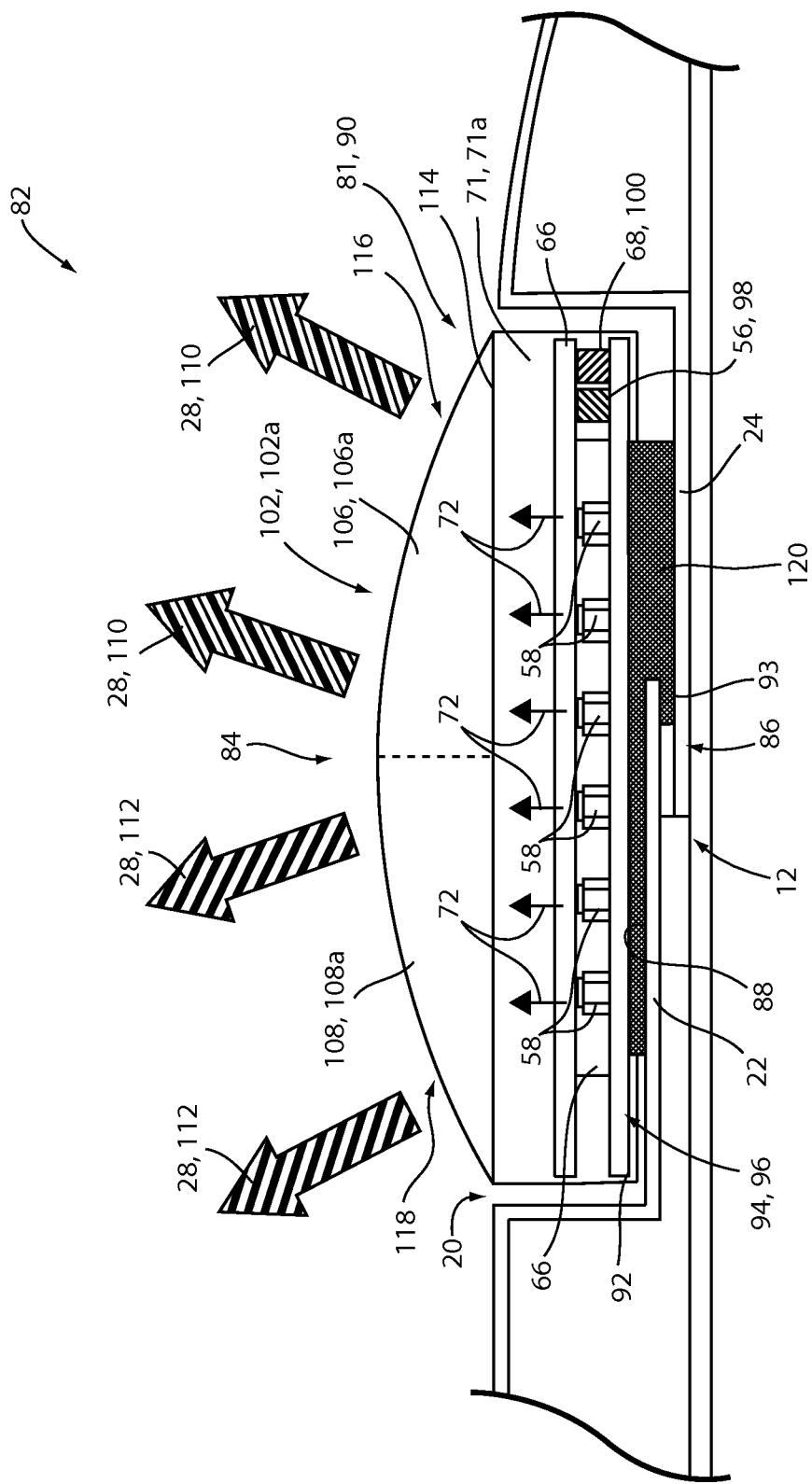
FIG. 4 is a cross-sectional view of a light producing assembly configured to illuminate a roof ditch of the vehicle.

Referring now to FIG. 4, a cross-sectional view of a roof ditch molding 81 corresponding to at least a portion of an illumination apparatus 82 is shown in accordance with the disclosure. The roof ditch molding 81 is disposed in the roof ditch 20. The illumination apparatus 82 may correspond to an embodiment of the illumination apparatus 10 introduced in FIG. 1. The illumination apparatus 82 comprises a light producing assembly 84 configured similar to the light producing assembly 18 as demonstrated in FIG. 2 with like-numbered elements having the same or comparable functions and structure. The light producing assembly 84 may be configured to substantially conform to the roof ditch 20. As shown in FIG. 4, the seam 12 interconnects the roof panel 22 to the body side panel 24, which may form an overlapping portion 86. The overlapping portion 86 may be fused and/or welded together to form the roof ditch 20. In this configuration, the illumination apparatus 82 may be operable to output light from the roof ditch 20 to provide attractive ambient illumination emitted therefrom.

The illumination apparatus 82 may be attached to a surface 88 of the roof ditch 20. The surface 88, may correspond to an elongated trough 90 formed by the intersection of the roof panel 22 and the body side panel 24. The illumination apparatus 82 may comprise a first electrode 92 in connection with the surface 88 via an adhesive 93. The first electrode 92 may be configured to transmit current through an electrically conductive body 94, which may also serve to form a base layer 96 of the illumination apparatus 82. The conductive body 94 may be of extruded aluminum having a conductive surface 97 configured to transmit current to the plurality of LED sources 58. As discussed previously, the LED sources 58 may be applied to the first electrode 92 via a printing operation, wherein the LED sources 58 in the form of a semiconductor ink are dispersed therein as a liquid suspension. The liquid suspension may comprise a concentration of LED sources 58 dispersed therein and form the at least one dielectric layer 66. The second electrode 64 may correspond to a top transparent conductor layer printed over the at least one dielectric layer 66 to electrically connect the electrodes 92 and 64. In this way, the bus bars 56, 68 may be utilized in the light producing assembly 18 to conductively connect a plurality of light-emitting diode (LED) sources 58 to a power source.

As discussed herein, each of the first electrode 92 and the second electrode 64 may be conductively connected to a first bus bar 56 and a second bus bar 68 respectively. In an exemplary embodiment, the bus bars 56, 68 may be in the form of electrical conductors configured to supply power to each of a plurality of lighting portions as further discussed in reference to FIG. 5. In such implementations, the electrical conductors may correspond to a first electrical supply bus 98 and a second electrical supply bus 100 and may be incorporated into the lighting producing assembly 84.

For example, the first electrical supply bus 98 and a second electrical supply bus 100 may be incorporated as integral portion of the lighting assembly 84 between the first electrode 92 and the second electrode 64. The first electrical supply bus 98 and the second electrical supply bus 100 may be of various conductive materials, for example copper, gold, aluminum, various metallic materials and their alloys. In some implementations, the electrical supply busses 98 and 100 may be of conductive materials having relatively low impedance such that the busses 98 and 100 may deliver power to the each of the lighting portions efficiently by limiting voltage drops along each portion or segment of the illumination apparatus 82. The electrical supply busses 98, 100 may be configured to electrically interconnect each of the plurality of lighting portions via the first electrode 92 and the second electrode 64 such that voltage may be supplied consistently along a length of the roof ditch 20 and each of the corresponding lighting portions.

In some embodiments, the first electrical power supply bus 98 and the second electrical power supply bus 100 may correspond to a plurality of power supply busses configured to selectively activate various portions of the LED sources 58. Each of the portions of LED sources 58 may correspond to different colors or wavelengths of LED sources 58 and/or portions of the LED sources 58 configured to emit excitation emissions. The excitation emissions may be at least partially converted to one or more colors of light to form the output emission 28. As such, the LED sources 58 may be configured to selectively output a plurality of colors of light in response to the activation of the plurality of power supply busses by the controller. The LED sources 58 may also be configured to emit one or more excitation emissions configured to excite one or more photoluminescent materials to emit one or more output emissions having desired colors.

The coating 71 or sealing layer may be applied to an exterior surface of the light producing assembly 84 to protect the light producing assembly 84 from damage and wear. The coating 71 may correspond to a polyethylene terephthalate (PET) film or other similar materials and may have approximate thickness ranging from approximately 0.1-0.75 millimeters. Additionally, in some implementations, a cover portion 102 may be disposed over the coating 71. The cover portion 102 may correspond to a polymeric material molded over the light producing assembly 84. The cover portion 102 may be of a clear plastic, silicon, urethane or similar materials molded on top of the light producing assembly 84 to extend the roof ditch molding 81 beyond an exterior surface 104 corresponding to exteriors surfaces of at least one of the panels 14.

In various implementations, the photoluminescent material of the energy conversion layer 74 may be disposed in the coating 71 and/or the cover portion 102. In such implementations, the photoluminescent material dispersed in the coating 71 and/or the cover portion 102 may correspond to the photoluminescent layer 70. In this configuration, the LED sources 58 may be configured to emit an excitation emission 72 or a first emission comprising a first wavelength, which may correspond to substantially blue light. The LED sources 58 may be configured to emit the excitation emission into the coating 71 and/or the cover portion 102 such that the photoluminescent material dispersed therein becomes excited. In response to the receipt of the excitation emission 72, the photoluminescent material converts the excitation emission 72 from the first wavelength to an output emission 28 comprising at least a second wavelength longer than the first wavelength.

In some embodiments, the coating 71 and/or the cover portion 102 may comprise a first photoluminescent portion 106 and a second photoluminescent portion 108. The first photoluminescent portion 106 may comprise a first photoluminescent material and the second photoluminescent portion 108 may comprise a second photoluminescent material. The first photoluminescent material may be configured to convert the excitation emission 72 to a second emission 110 output from the illumination apparatus 82. The second photoluminescent material may be configured to convert the excitation emission 72 to a third emission 112 output from the illumination apparatus 82. The second emission 110 and the third emission 112 may each correspond to output emissions, similar to the output emission 28, and may similarly be configured to illuminate an outer surface 114 of the coating 71 and/or the cover portion 102 in a first color and a second color, respectively.

In some embodiments, the first photoluminescent portion 106 may correspond to an outward facing portion 116 or hemisphere of the cover 102, and the second photoluminescent portion 108 may correspond to an inward facing portion 118 or hemisphere of the cover 102. The terms inward directed and outward as discussed in reference to the portions 116 and 118 may correspond to inward directed substantially toward a centerline extending in the fore-aft direction of the roof panel 22 and to outward directed substantially away from the centerline extending in the fore-aft direction of the vehicle 16. In this configuration, the illumination apparatus 82 may be operable to emit the second emission 110 having a first output color outward from the body side panel 24. The illumination apparatus 82 may further be operable to illuminate the roof panel 22 in a second output color of light. Each of the output emissions 28 as discussed herein may be selectively activated in response to an activation of the plurality of LED sources 58 generating the first or excitation emission to excite the one or more photoluminescent materials of the illumination apparatus 82.

In some implementations, the coating 71 may correspond to an overmolded seal 71a configured to enclose or encapsulate the illumination apparatus 82. Additionally, the cover 102 may be molded in a single shot molding with the overmolded seal 71a and/or be molded to the overmolded seal 71a as an overmolded cover 102a as a second shot molding applied over at least a portion of the overmolded seal 71a. In an exemplary embodiment, the overmolded cover may be applied as a first cover portion 106a corresponding to the first photoluminescent portion 106 and a second cover portion 108a corresponding to the second photoluminescent portion 108. In this configuration the first cover portion 106a may be applied as a second shot molding over the overmolded seal 71a and the second cover portion 108a may be applied as a third shot molding over the overmolded seal 71a. In this configuration, the first cover portion 106a may contain a first photoluminescent material corresponding to the first photoluminescent portion 106, and the second cover portion 108a may contain a second photoluminescent material corresponding to the second photoluminescent portion 108.

Each of the overmolded seal 71a, the first cover portion 106a, and the second cover portion 108a may correspond to a variety of materials. In some implementations, the overmolded seal 71a may be of a heat conducting plastic configured to transfer heat away from the illumination apparatus 82. The heat conducting plastic may correspond Celanese CoolPoly® D-Series or various other materials that may be molded and provide for heat conduction. In some embodiments, the overmolded seal 71a, the first cover portion 106a, and the second cover portion 108a may be of Polypropylene. Polypropolene is a semi-crystalline polymer. The presence of this crystalline structure may enhance the stiffness, as well as the mechanical, chemical and thermal resistance of the material. Polypropylene normally crystallizes slowly and forms relatively large complex crystal aggregates known as spherulites. The growth of these spherulites is generally initiated around microscopic "sites" naturally present in the material.

Without clarifier, the size of these spherulites is generally larger than the wavelength of visible light resulting in light scattering and hazing of the emissions output from the illumination apparatus. Adding a clarifier to polypropylene is equivalent to introducing "additional sites" in which spherulites can initiate their growth. As such, in some embodiments, the polypropylene may be clarified with a clarifier, for example Milliken Chemicals Millad 8000 or similar products. By adding the clarifier, the rate of crystal initiation is increased throughout the polypropylene. This may provide for an increased number of crystals in the same amount of space provided by the smaller size of the crystals. The result of the smaller crystals to allow light to pass through the overmolded portions, for example the overmolded seal 71a, the first cover portion 106a, and the second cover portion 108a. In some implementations, acrylic material may be utilized for the overmolded portions.

In some embodiments, the illumination apparatus 82 may comprise a retention detail 120 configured to interlock with at least a portion of the roof ditch 20. The retention detail 120 may be affixed to the roof panel 22 and the body side panel 24 by the adhesive 93. The retention detail 120 may provide for both a mechanical attachment of the illumination apparatus 82 to the roof ditch 20 as well as provide alignment for the roof ditch molding 81 within the roof ditch 20. In this way, the roof ditch molding 81 may be consistently aligned in the roof ditch 20 during an assembly operation.

Figure 5:
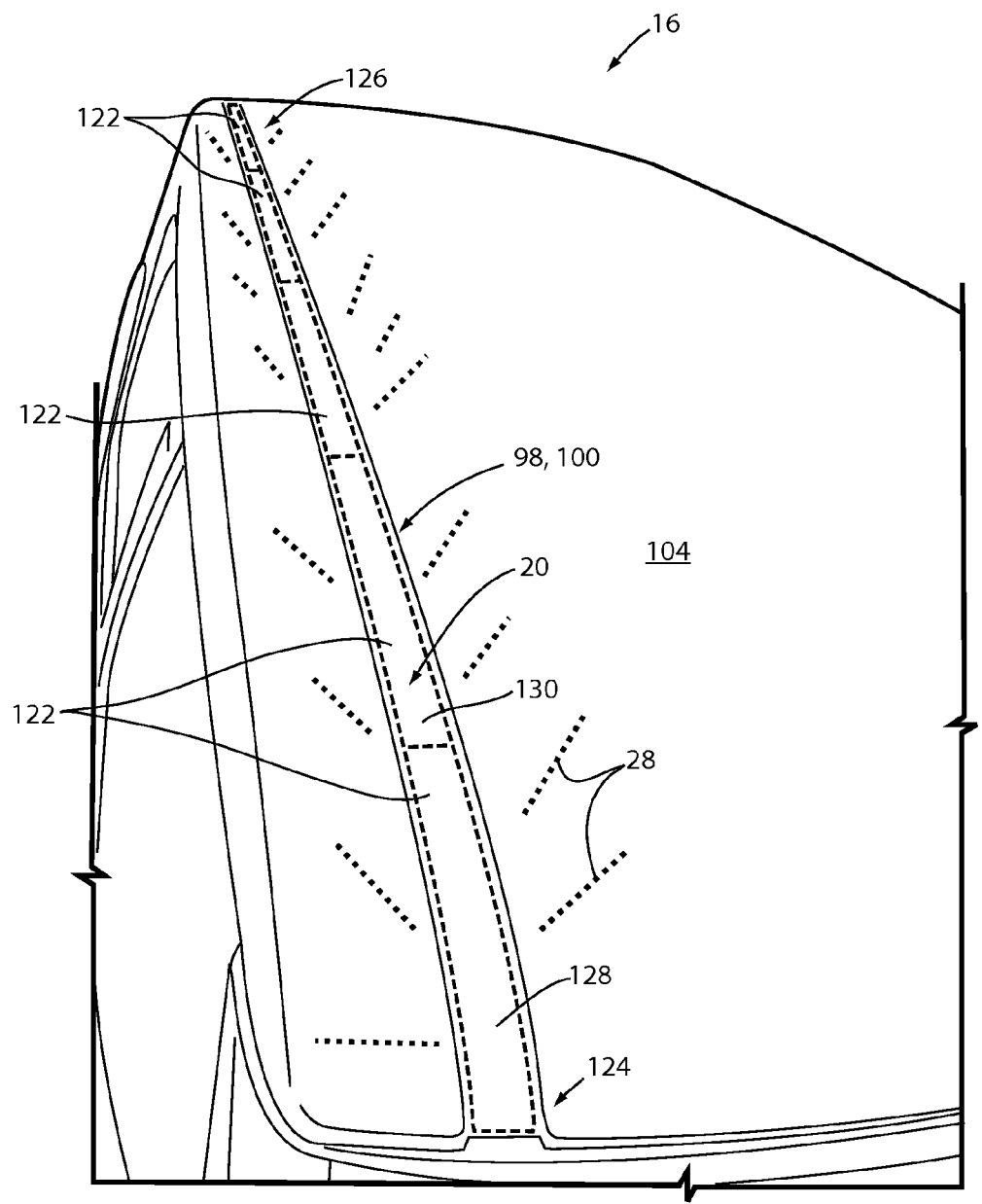
FIG. 5 is a detailed perspective view of a roof of the vehicle closure demonstrating a plurality of lighting portions of an illumination apparatus.
Figure 6:
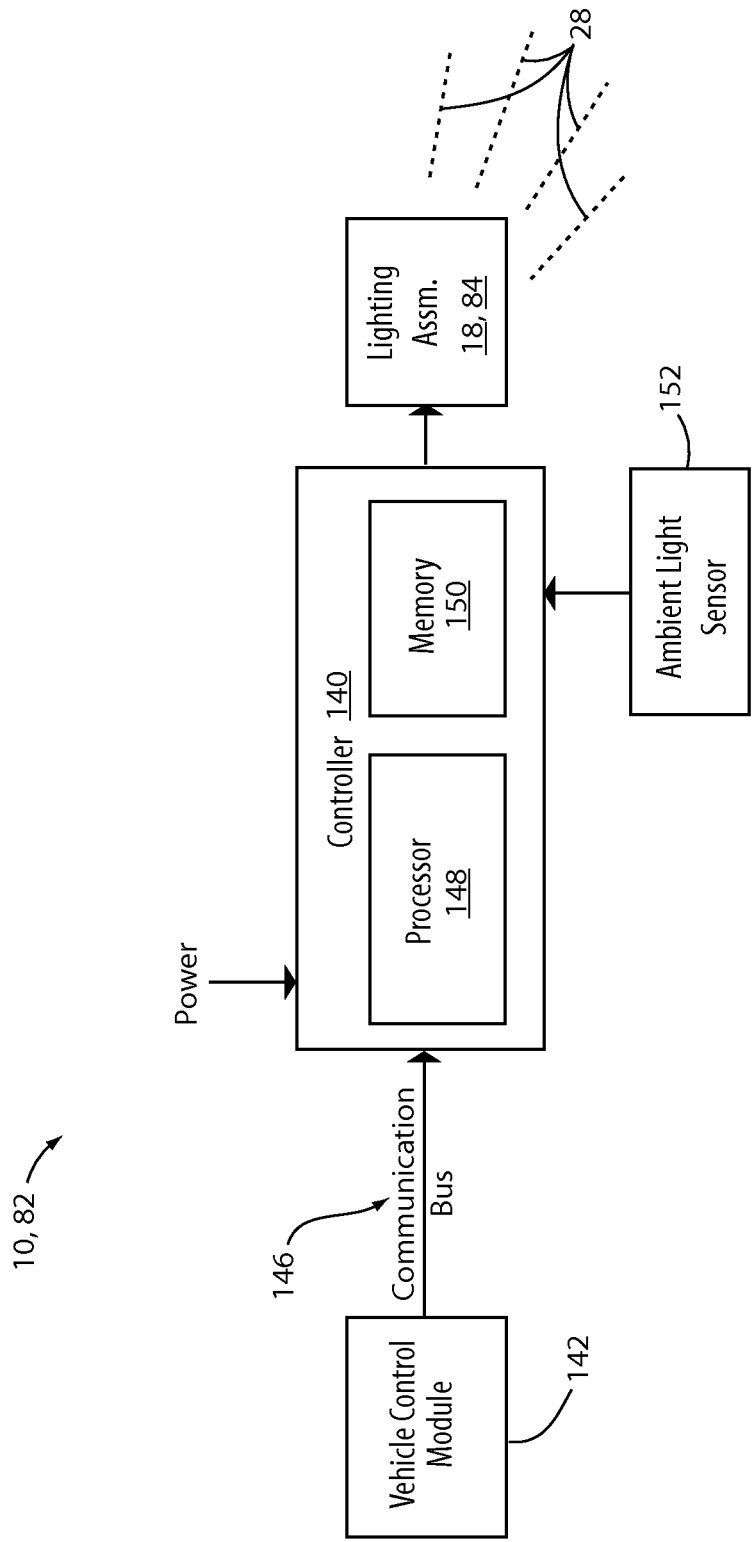
FIG. 6 is a block diagram of a lighting illumination apparatus in accordance with the disclosure.

FIG. 5 is a perspective view of the exterior surface 104 of the vehicle 16 demonstrating a plurality of lighting portions 122 of the illumination apparatus 82. Referring now to FIGS. 5 and 6, as discussed previously, each of the lighting portions 122 may be supplied light from the first electrical supply bus 98 and the second electrical supply bus 100. Each of the first electrode 92 and the second electrode 64 of each lighting portions 122 may be conductively connected to the first electrical supply bus 98 and the second electrical supply bus 100, respectively. In this configuration, the electrical supply busses 98, 100 may be configured to interconnect each of the plurality of lighting portions via the first electrode 92 and the second electrode 64 such that voltage may be supplied consistently along a length of the roof ditch 20 and each of the lighting portions 122. This configuration may provide for the output emissions 28 to be emitted substantially consistently along the roof ditch 20.

As shown in FIG. 5, the lighting apparatus 82 comprises five lighting portions 122 disposed in the roof ditch 20 of the vehicle 16. The number of lighting portions may vary widely based on each implementation of the illumination apparatus 10 discussed herein. In some implementations, the lighting portions 122 may form a single contiguous roof ditch molding assembly extending from a fore portion 124 of the roof ditch 20 to an aft portion 126 of the roof ditch 20.

Additionally, in some implementations, each of the lighting portions 122 may be configured to output the output emissions 28 in a variety of colors. For example, a first lighting portion 128 may be configured to emit red light in response to the controller activating the excitation emission 72. A second lighting portion 130 may be configured to emit blue light in response to the controller activating the excitation emission 72. Each of the output emissions 28 of light emitted from the lighting portions may be controlled by utilizing various photoluminescent materials in each of the lighting portions 122 to generate a desired color effect for each of the output emissions 28 emitted therefrom, respectively.

Referring to FIG. 6, a block diagram corresponding to the illumination apparatuses 10 and 82 is shown. The controller 140 is in communication with the light assembly via the electrical supply busses discussed herein. The controller 140 may be in communication with the vehicle control module 142 via a communication bus 146 of the vehicle. The communication bus 146 may be configured to deliver signals to the controller 140 identifying various vehicle states. For example, the communication bus 146 may be configured to communicate to the controller 140 a drive selection of the vehicle 16, an ignition state, a door open or ajar status, a remote activation of the illumination apparatus 10, or any other information or control signals that may be utilized to activate or adjust the output emission 28. Though the controller 140 is discussed herein, in some embodiments, the illumination apparatus 10 may be activated in response to an electrical or electro-mechanical switch in response to a position of a closure (e.g. a door, hood, truck lid, etc.) of the vehicle 16.

The controller 140 may comprise a processor 148 comprising one or more circuits configured to receive the signals from the communication bus 146 and output signals to control the illumination apparatus 10, 82 to emit the output emission 28. The processor 148 may be in communication with a memory 150 configured to store instructions to control the activation of the illumination apparatus 10, 82. The controller 140 may further be in communication with an ambient light sensor 152. The ambient light sensor 152 may be operable to communicate a light condition, for example a level brightness or intensity of the ambient light proximate the vehicle 16. In response to the level of the ambient light, the controller 140 may be configured to adjust a light intensity output from the illumination apparatus 10. The intensity of the light output from the illumination apparatus 10 may be adjusted by controlling a duty cycle, current, or voltage supplied to the illumination apparatus 10.

For the purposes of describing and defining the present teachings, it is noted that the terms "substantially" and "approximately" are utilized herein to represent the inherent degree of uncertainty that may be attributed to any quantitative comparison, value, measurement, or other representation. The term "substantially" and "approximately" are also utilized herein to represent the degree by which a quantitative representation may vary from a stated reference without resulting in a change in the basic function of the subject matter at issue.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. An illumination apparatus for a vehicle comprising:
a plurality of lighting portions disposed in an elongated trough formed by an intersection of a roof panel and a body side panel forming a seam, each comprising:
a first electrode;
a plurality of printed LEDs suspended in a semiconductor ink on a surface of the first electrode;
a second electrode in electrical connection with the plurality of LEDs; and
a photoluminescent layer disposed on the second electrode; and
a plurality of electrical conductors extending along the plurality of lighting portions and are in connection with at least one of the first electrode and the second electrode to supply power to each of the lighting portions.

2. The illumination apparatus according to claim 1, wherein the first electrode forms a base portion of each lighting portion.

3. The illumination apparatus according to claim 2, wherein the plurality of electrical conductors are in communication with a controller configured to selectively illuminate each of the lighting portions.

4. The illumination apparatus according to claim 2, wherein the plurality of electrical conductors are disposed within the lighting portions and interconnect each of the lighting portions.

5. The illumination apparatus according to claim 1, wherein the seam corresponds to an intersecting portion wherein a first panel of the vehicle and a second panel of the vehicle are joined.

6. The illumination apparatus according to claim 5, wherein the first panel corresponds to a body side panel and the second panel corresponds to a roof panel of the vehicle.

7. The illumination apparatus according to claim 1, wherein the seam corresponds to a roof ditch forming an elongated trough along a longitudinal portion of the seam.

8. The illumination apparatus according to claim 1, wherein the first electrode is connected to the seam by an adhesive configured to seal the seam.

9. An illumination apparatus comprising:
a first electrode in connection with a seam of a roof ditch via an adhesive;
a plurality of printed LEDs configured to emit a first emission and suspended in a semiconductor ink disposed on a surface of the first electrode;
a second electrode in electrical connection with the plurality of LEDs;
a photoluminescent layer disposed on the second electrode; and
a retention detail connecting the apparatus to a roof ditch seam.

10. The illumination apparatus according to claim 9, wherein
the first emission corresponds to a first color of light having a wavelength less than 500 nm.

11. The illumination apparatus according to claim 9, wherein the plurality of LEDs are configured to transmit the first emission into the photoluminescent layer wherein a photoluminescent material of the photoluminescent layer converts the first emission to a second emission having a second color, different from the first color.

12. The illumination apparatus according to claim 9, wherein the photoluminescent layer corresponds to a molded cover portion disposed proximate the second electrode and configured to receive the first emission.

13. The illumination apparatus according to claim 12, wherein the photoluminescent layer comprises a first photoluminescent material and a second photoluminescent material.

14. The illumination apparatus according to claim 13, wherein the first photoluminescent material is disposed in an outer section of the molded cover portion and is configured to convert the first emission to a second emission directed substantially toward a body side panel of the vehicle.

15. The illumination apparatus according to claim 14, wherein the second photoluminescent material is disposed in an inner section of the molded cover portion and is configured to convert the first emission to a third emission directed substantially toward a roof panel of the vehicle.

16. The illumination apparatus according to claim 15, wherein each of the first emission, the second emission, and the third emission correspond to substantially different colors of light.

17. An illumination apparatus comprising:
a plurality of lighting portions extending along and disposed in a trough formed by a roof panel and a body side panel of a vehicle comprising:
a first electrode in connection with a seam of the roof ditch via an adhesive;
a plurality of printed LEDs configured to emit a first emission and suspended in a semiconductor ink disposed on a surface of the first electrode;
a second electrode in electrical connection with the plurality of LEDs; and
a photoluminescent layer disposed on the second electrode; and
a controller in communication with the first and second electrodes and configured to selectively illuminate the plurality of lighting portions.

18. The illumination apparatus according to claim 17, wherein the plurality of lighting portions corresponds to a first photoluminescent portion configured to emit a first color of light and a second photoluminescent portion configured to emit a second color of light.

19. The illumination apparatus according to claim 18, wherein the controller is configured to selectively illuminate the illumination apparatus in the first color in response to a first vehicle status signal and the second color in response to a second vehicle status signal.

20. The illumination apparatus according to claim 9, wherein the retention detail is configured to interlock between a roof panel and a body side panel forming the roof ditch seam.

* * * * *